(12) United States Patent
Burr et al.

(10) Patent No.: US 8,811,060 B2
(45) Date of Patent: Aug. 19, 2014

(54) NON-VOLATILE MEMORY CROSSPOINT REPAIR

(75) Inventors: Geoffrey W. Burr, Cupertino, CA (US); Rohit S. Shenoy, Fremont, CA (US); Kailash Gopalakrishnan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 13/485,748

(22) Filed: May 31, 2012

(65) Prior Publication Data
US 2013/0322153 A1    Dec. 5, 2013

(51) Int. Cl.
*G11C 11/00* (2006.01)
*G11C 13/00* (2006.01)

(52) U.S. Cl.
CPC .................................. *G11C 13/0069* (2013.01)
USPC ........................................... 365/148; 365/163

(58) Field of Classification Search
CPC .......................... G11C 13/0069; G11C 11/0004
USPC ........................................... 365/148, 163, 225.7
See application file for complete search history.

(56) References Cited

U.S. PATENT DOCUMENTS

| | | | |
|---|---|---|---|
| 5,257,222 A | 10/1993 | Lee | |
| 5,347,489 A | 9/1994 | Merchant et al. | |
| 6,160,737 A | 12/2000 | Hsu et al. | |
| 6,178,117 B1 | 1/2001 | Cleveland | |
| 6,496,417 B1 | 12/2002 | Shiau et al. | |
| 6,498,739 B2 | 12/2002 | Cloud et al. | |
| 6,922,366 B2 | 7/2005 | Micheloni et al. | |
| 6,977,836 B2 | 12/2005 | Gendrier et al. | |
| 7,650,528 B2 | 1/2010 | Rahman et al. | |
| 2009/0235145 A1 | 9/2009 | Ito et al. | |
| 2010/0030949 A1 | 2/2010 | Lakhani et al. | |
| 2011/0103132 A1* | 5/2011 | Wei et al. | 365/148 |

FOREIGN PATENT DOCUMENTS

WO        2010/110938 A2        9/2010

OTHER PUBLICATIONS

Padilla et al., "Voltage Polarity Effects in Ge2Sb2Te2-based phase change memory devices," 2011 American Institute of Physics, Journal of Applied Physics, vol. 110, pp. 054501/1-054501-12.
Padilla et al., "Voltage polarity effects in GST-based Phase Change Memory: Physical origins and implications," 2010 IEEE, IEDM10-656, pp. 29.4.1-29.4.4.

* cited by examiner

*Primary Examiner* — Huan Hoang
(74) *Attorney, Agent, or Firm* — Zilka-Kotab, PC

(57) ABSTRACT

A device for use with a memory cross-point array of elements, each of which comprises a selection device in series with a state-holding device, in one embodiment includes a controller, configured to apply at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected. Additional systems and methods are also presented.

23 Claims, 12 Drawing Sheets

700

Applying a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected. ⟵ 702

FIG. 7

NON-VOLATILE MEMORY CROSSPOINT REPAIR

BACKGROUND

The present invention relates to non-volatile memory, and more specifically, this invention relates to a crosspoint array of non-volatile memory (NVM) devices in series with a selection device.

Conventional systems and methods incorporate crosspoint arrays for storing data to memory. However, when even a single element in a crosspoint array is compromised, this has an undesirable amplifying effect on the entire array yield thereby leading to an overall low array yield. Particularly, if an element fails as a short, then the corresponding bitline and wordline will draw far too much current to ensure a reliable read and/or write of any other device along the same wordline and/or bitline.

This is a serious problem for successful commercialization. Even for fairly low selection device fail-rates (e.g., high individual selection device yield), the occurrence of uncompromised bitlines and wordlines becomes exceedingly rare. Thus in order to obtain a reasonably high array yield for manufacturing (e.g., greater than about 99%) using conventional systems and methods, it is necessary to have incredibly, and probably unfeasibly high yield for individual elements.

BRIEF SUMMARY

According to one embodiment, a method for use with a memory cross-point array of elements, each of which comprises a selection device in series with a state-holding device, includes: applying at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

In another embodiment, a device for use with a memory cross-point array of elements, each of which comprises a selection device in series with a state-holding device, includes a controller, configured to apply at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

A method for use with a memory cross-point array of nonlinear elements according to one embodiment includes applying a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected.

A device for use with a memory cross-point array of non-linear elements according to another embodiment includes a controller configured to apply a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 7 depicts a method process step according to one embodiment.

DETAILED DESCRIPTION

Figure 1:
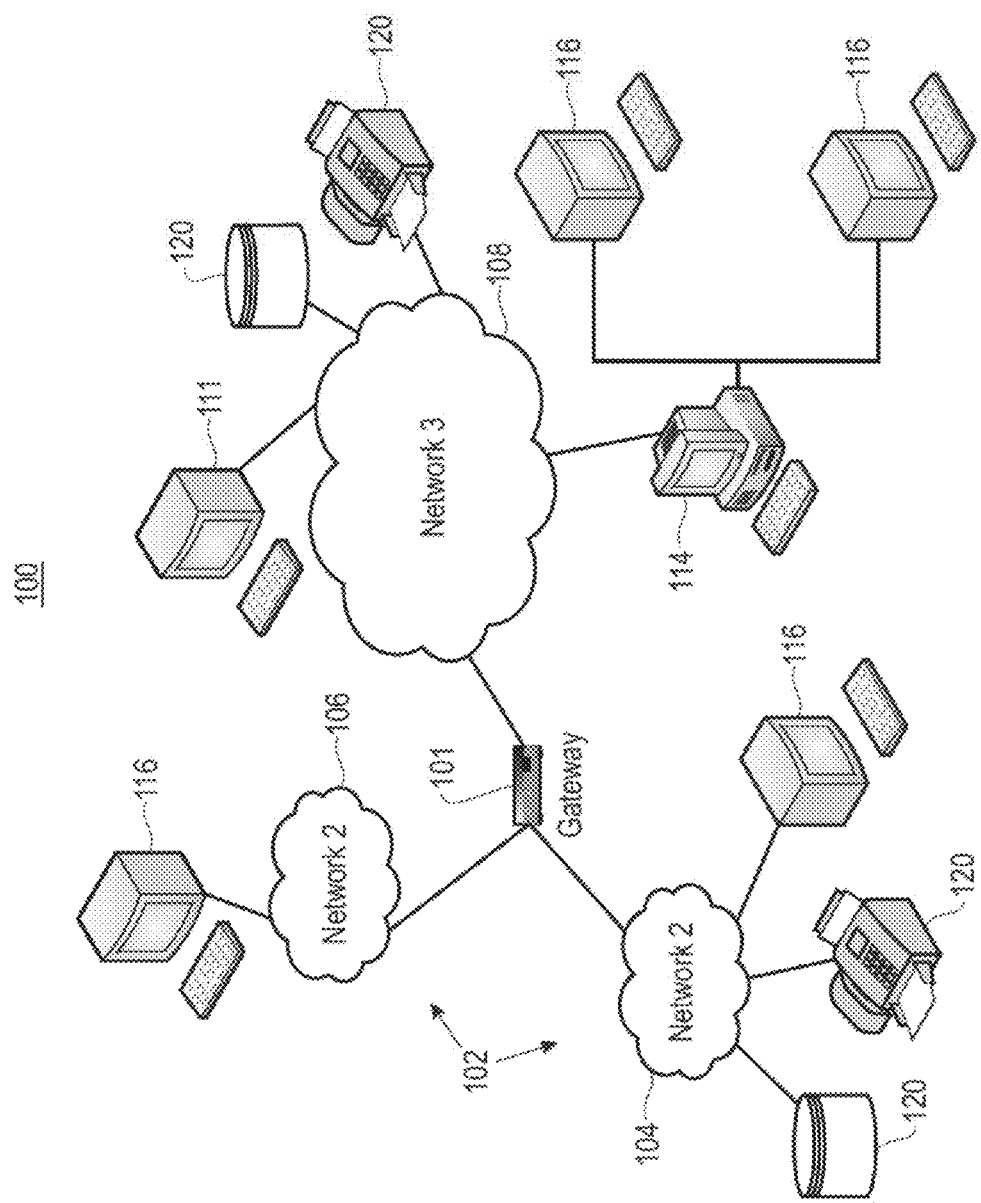
FIG. 1 illustrates a network architecture, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for placing selected elements of a memory cross-point array of elements in a highly resistive state.

In one general embodiment, a method for use with a memory cross-point array of elements, each of which comprises a selection device in series with a state-holding device, includes: applying at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

In another general embodiment, a device for use with a memory cross-point array of elements, each of which comprises a selection device in series with a state-holding device, includes a controller, configured to apply at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

In yet another general embodiment, a method for use with a memory cross-point array of nonlinear elements includes applying a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected.

In another general embodiment, a device for use with a memory cross-point array of nonlinear elements includes a controller configured to apply a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," "module," or "system." Furthermore, aspects of the present invention may take the form of a computer program product embodied in one or more computer readable medium(s) having computer readable program code embodied thereon.

Any combination of computer readable media may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer readable storage medium include the following: a portable computer diskette, a hard disk, a random access memory (RAM), a read-only memory (ROM), an erasable programmable read-only memory (EPROM or Flash memory), a portable compact disc read-only memory (e.g., CD-ROM), a Blu-ray disc read-only memory (BD-ROM), an optical storage device, a magnetic storage device, or any suitable combination of the foregoing. In the context of this document, a non-transitory computer readable storage medium may be any tangible medium that is capable of containing, or storing a program or application for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a non-transitory computer readable storage medium and that can communicate, propagate, or transport a program for use by or in connection with an instruction execution system, apparatus, or device, such as an electrical connection having one or more wires, an optical fibre, etc.

Program code embodied on a computer readable medium may be transmitted using any appropriate medium, including but not limited to wireless, wireline, optical fibre cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer, for example through the Internet using an Internet Service Provider (ISP).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a network architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
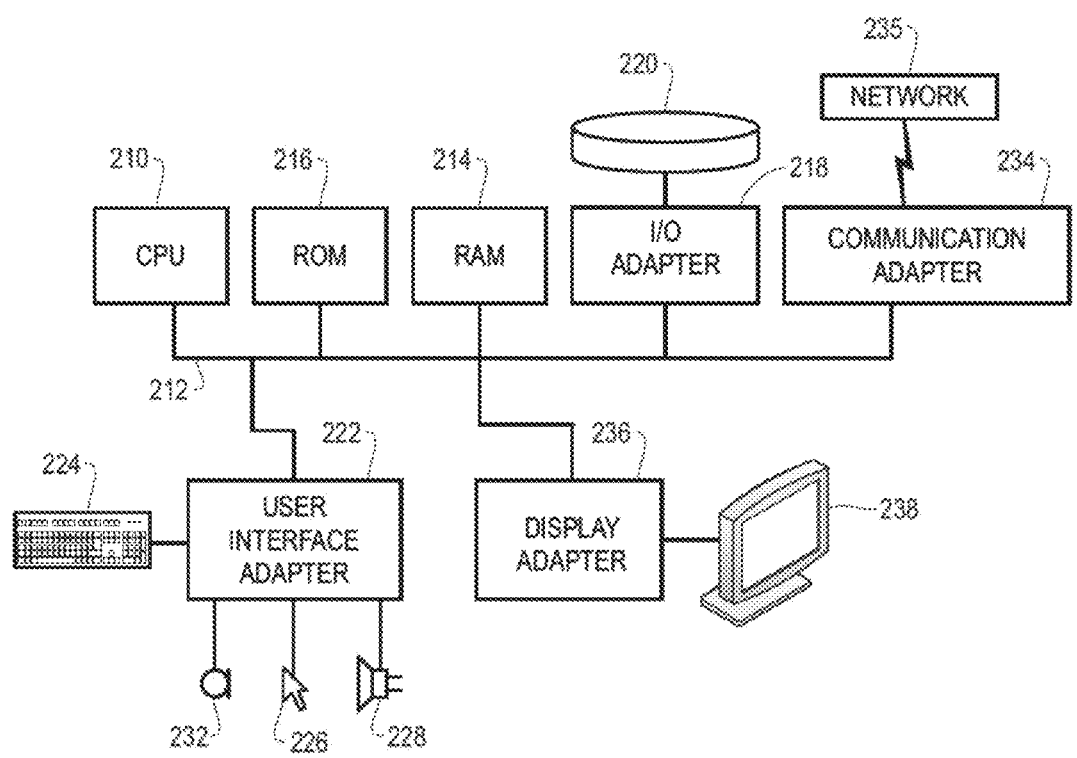
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as memory devices 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 3:
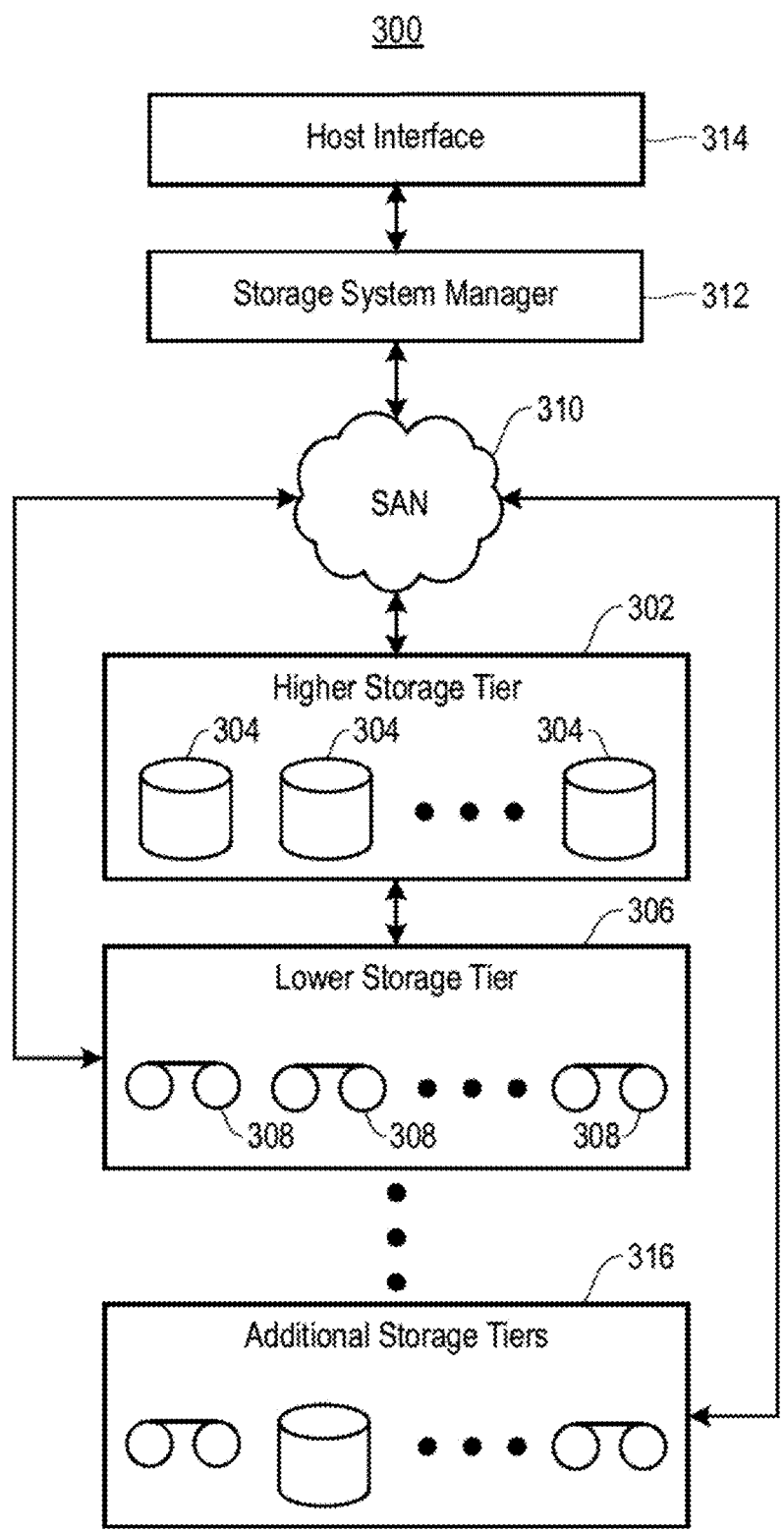
FIG. 3 illustrates a tiered data storage system in accordance with one embodiment.

Now referring to FIG. 3; a storage system 300 is shown according to one embodiment. Note that some of the elements shown in FIG. 3 may be implemented as hardware and/or software, according to various embodiments. The storage system 300 may include a storage system manager 312 for communicating with a plurality of media on a higher storage tier 302 and a lower storage tier 306. The higher storage tier 302 preferably may include one or more random access and/or direct access media 304, such as hard disks in hard disk drives (HDDs), nonvolatile memory (NVM), solid state memory in solid state drives (SSDs), etc., and/or others noted herein. The lower storage tier 306 may preferably include one or more sequential access media 308, such as magnetic tape in tape drives, optical media, etc., and/or others noted herein. Additional storage tiers 316 may include any combination of storage memory media. The storage system manager 312 may communicate with the storage media 304, 308 on the higher and lower storage tiers 302, 306 through a network 310, such as a storage area network (SAN), as shown in FIG. 3. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 300 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the embodiments presented herein.

According to some embodiments, the storage system (such as 300) may include logic adapted to receive a request to open a data set, logic adapted to determine if the requested data set is stored to a lower storage tier 306 of a tiered data storage system 300 in multiple associated portions, logic adapted to move each associated portion of the requested data set to a higher storage tier 302 of the tiered data storage system 300, and logic adapted to assemble the requested data set on the higher storage tier 302 of the tiered data storage system 300 from the associated portions.

Figure 4A:
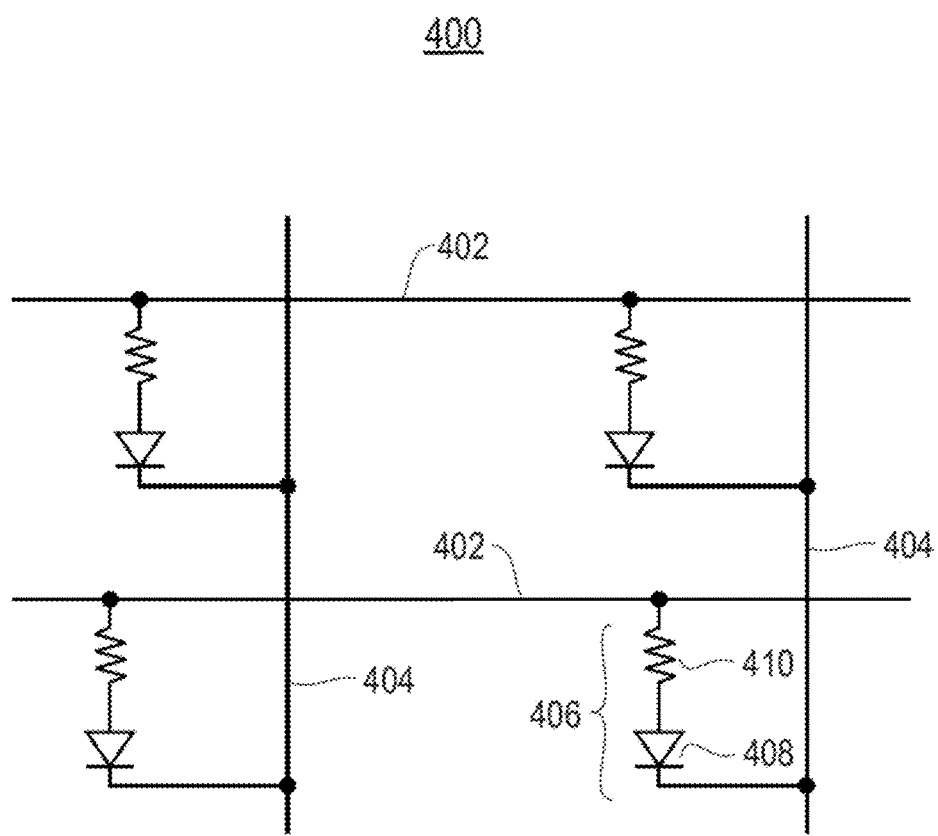
FIG. 4A depicts a circuit diagram of a portion of a crosspoint array according to one embodiment.

FIG. 4A depicts a portion of a crosspoint array 400, in accordance with one embodiment. As an option, the present crosspoint array 400 may be implemented in conjunction with features from any other embodiment listed herein, such as those described with reference to the other FIGS. Of course, however, such crosspoint array 400 and others presented herein may be used in various applications and/or in permutations which may or may not be specifically described in the illustrative embodiments listed herein. Further, the crosspoint array 400 presented herein may be used in any desired environment.

FIG. 4A depicts a portion of the crosspoint array 400 according to one embodiment. Each of the elements 406 of the crosspoint array 400 may include a selection device 408 e.g., a nonlinear device, such as a diode, bipolar copper-containing Mixed Ionic-Electronic Conduction (MIEC) devices of a type known in the art, other diode-like devices, etc. A selection device may preferably be incorporated as to establish a selection scheme which is able to read and/or write in a range of voltages applied to the array (explained in further detail below).

With continued reference to FIG. 4A, the selection device 408 may be in series with a separate state-holding device 410 (e.g., a phase change memory element; a resistive memory element e.g., Resistive RAM (RRAM), Spin Torque-Transfer Magnetic RAM (STT-MRAM), Conductive Bridging RAM (CBRAM), etc.). However, according to one approach, a single device may provide functionality corresponding to a selection device and a state-holding device; and the like.

In one embodiment, the state-holding device 410 may preferably include a programmable resistance device which may be accessed in two modes (e.g., a high and a low resistance). According to one approach, the two modes may include a read mode and a write mode which may be represented in binary by 1 data bit, which can either be a 1 (e.g., high resistance) or a 0 (e.g., low resistance).

According to various approaches, the high and low resistances may preferably have a 10 to 100 fold difference between them, but could be higher or lower based on the desired embodiment. Furthermore, in various approaches, the low resistance value may be about 1 k$\Omega$ to about 10 k$\Omega$, but could be higher or lower based on the desired embodiment. Moreover, in various approaches, the high resistance value may be about 1 M$\Omega$ to about 10 M$\Omega$, but could be higher or lower based on the desired embodiment. In another approach, 2 data bits may be included to incorporate multi-level cells, multi-analog values, etc.

According to a preferred illustrative embodiment, the elements 406 of the crosspoint array 400 may each incorporate a series stack of individual two-terminal devices, thereby creating a two-terminal memory element.

With continued reference to FIG. 4A, the bitlines 402 are oriented perpendicular to the wordlines 404. Moreover, the elements 406 electrically connect the bitlines 402 and the wordlines 404. According to various approaches, the elements 406 may electrically connect the bitlines 402 and the wordlines 404 via a wire, a cable, etc.

A controller (not shown) may be coupled to the bitlines 402 and the wordlines 404 for addressing the memory elements 406. According to various approaches, the controller may be internal to the memory device, in a monolithic structure that also includes the array 400, etc. The array may be coupled to an interface that is coupleable to a host device, the controller, etc. If the controller is integrated, the controller may be coupled to such an interface.

One advantage of a memory crosspoint array of elements is that they can be made very densely. In one approach, each element, at the intersection of crossed wires, may be lithographically defined at a pitch down to 2F, where F represents the width of each wire, as well as the space between wires. Thus the area per element may be represented by $(4F)^2$ in some approaches.

If the NVM and selection device do not require single crystal silicon (e.g., phase-change memory (PCM), resistive RAM (RRAM), Magnetic RAM (MRAM), etc.;) and a selection device (e.g., a polycrystalline silicon diode, bipolar copper-containing MIEC device, etc.), then multiple layers of crosspoint array memory may be built above the silicon layer holding the driving and addressing circuitry, thereby further increasing the memory density of the crosspoint array. However, crosspoint arrays have heretofore presented a major problem concerning overall array yield as described below in further detail.

As mentioned above, crosspoint arrays are prone to low device yields due to errors sustained in the elements. Consequently, the low yields on the device level are amplified such that the entire array yield suffers as well, as will soon become apparent.

Any particular faulty crosspoint element may fall into one of three possibilities. In the first situation, if the selection device is unaffected, but the NVM state-holding device is dead, then the bit corresponding to that element will be unwriteable, but the remainder of the array is unaffected. In the second scenario, if the selection device fails as an open (i.e., highly resistive state), then the bit corresponding to that element will be unwriteable, but the remainder of the array is unaffected.

In the third possibility, the array may have a nearly- or completely-shorted selection device, such that the selection device becomes insufficiently nonlinear. In one approach, if the selection device fails as a short, then the corresponding bitline and wordline will draw far too much current to ensure a reliable read of any other device along the same wordline and/or bitline. Therefore, even a few shorted selection devices may lead to a devastatingly low array yield, which is extremely undesirable. In one illustrative array, without the repair facility described herein, the errors experienced in the elements would need to be limited to 1 error in $10^6$ elements to achieve a manufacturable array yield of 99.9%.

Thus, as explained above, a partially- or completely-shorted selection device may lead to a devastatingly low array yield by affecting any read and/or write operation on the corresponding line. The selection device may preferably be nonlinear; allowing a small amount of current for a very low voltage, and a much larger amount of current for a large voltage. Moreover, the selection device protects the state-holding device from damage; therefore, when there is a shorted select device in one of the elements, the associated state-holding device is effectively unprotected from damage.

To remedy the foregoing problems, several of the systems and methods described and/or suggested herein attempt to remove the leakage caused by shorted selection devices by intentionally damaging the NVM state-holding device connected to them and/or the selection devices themselves.

According to one approach, damaging the NVM state-holding device includes placing the state-holding device into a high resistance state. As a result, devices with defective selection devices (e.g., partially- or completely-shorted) are sacrificed, either individually or in parallel, thereby reducing the leakage seen throughout the whole crosspoint array. Consequently, the yield of a given array may be high because entire wordlines and bitlines are not compromised by presence of leaky selection devices.

According to one embodiment, it may be preferable to initially identify if there are any shorts in the circuitry of the crosspoint array memory; and if so, the bitlines and wordlines which correspond to such shorts.

Even very low read voltages may draw too much current on some bitlines and/or wordlines. Yet, even this fails to pinpoint exactly which elements may be damaged, because it is still unknown which combinations of bitlines and wordlines have defective devices. In one approach, it may be possible to suspect bad elements located at intersecting bitlines and wordlines which are experiencing leaks. However, because there is still uncertainty associated with suspecting defective elements, anything done to repair or disable the suspected defective elements should not damage the good (e.g., not shorted) elements, thereby protecting them from any unintentional damage.

Accordingly, in one embodiment, a current may be applied to each of the bitlines or wordlines to detect whether current leakage is detected. Such applying may be sequential, all at once, in groups, etc. Preferably, the elements (e.g., PCM) are all placed in a high resistance state (if possible) to make detection of the leakage more evident.

Figure 5A:
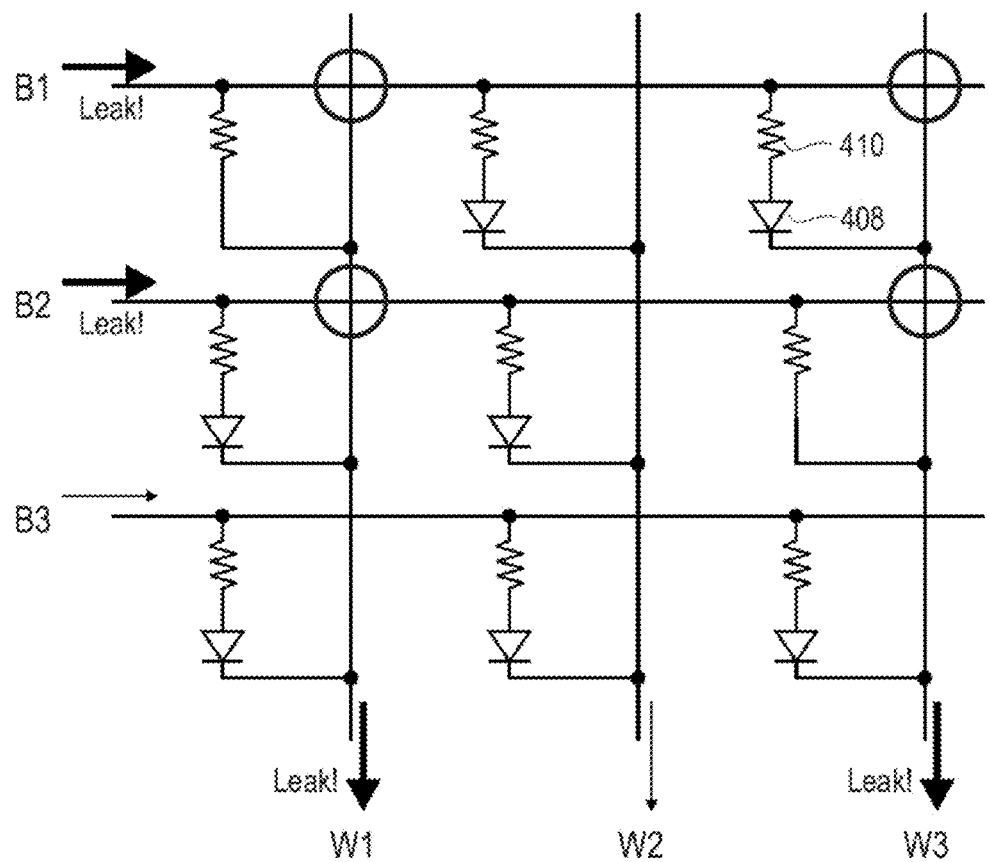
FIGS. 5A-5D depict a memory array according to one embodiment.

Consider FIG. 5A, illustrating an array of elements 406 having suspected defective elements on bitlines B1 and B2, and on wordlines W1 and W3, as evidenced by a detected leakage of current. The circles show the intersection of the bitlines and wordlines having suspected leaks. In this example, although there are only two defective elements (first element in top row, last element in second row), all elements coupled to the bitlines and wordlines exhibiting leakage are suspect and/or unusable, whether such elements are actually defective or not. Thus, only one of the nine elements is considered usable, that element being the middle element of the bottom row having a bitline and wordline that exhibit no leakage.

Now that the bitlines and wordlines having shorts have been identified, an attempt is made to damage the elements at the intersections identified above as suspect to place only the elements having partial or complete shorts into a highly resistive state. As noted herein, those nondefective elements are not damaged.

Figure 5B:
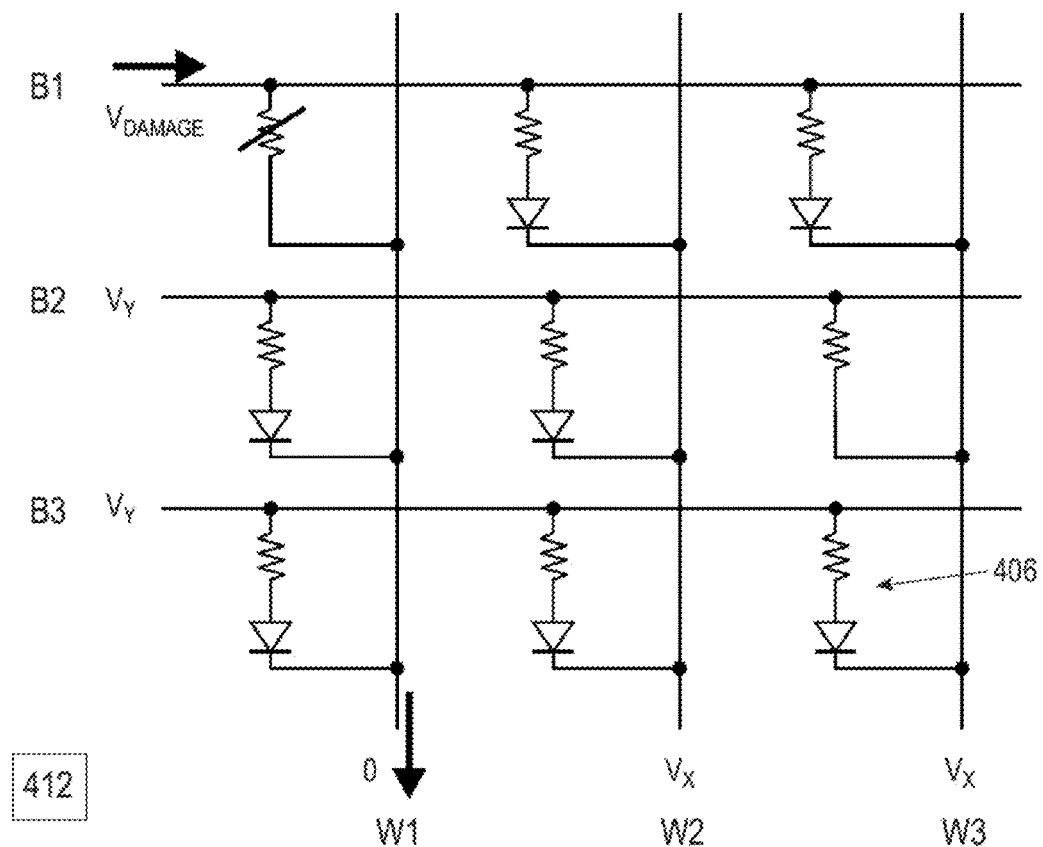

Referring to FIG. 5B, a voltage and/or predefined current pulse (including a pulse sequence) may be applied to a bitline (B1) exhibiting leakage. (Note that any voltage application necessarily includes some type of pulse corresponding to on/off tune. Likewise, a pulse has a voltage of some magnitude in order to drive the current.) The corresponding wordline may be grounded or set to a lower potential, while the other wordlines and/or bitlines may be set to a potential $V_X$, $V_Y$ higher than that of W1, but lower than $V_{DAMAGE}$. Here, assume a voltage ($V_{DAMAGE}$) is applied to B1. If the combination of bitline and wordline does have a shorted selection device coupled therebetween, nearly all of the $V_{DAMAGE}$ will appear across the element, with very little drop across the selection device.

Upon application of the voltage, the partially- or completely-shorted selection device (in this example, of the first element in the top row) may allow enough current to pass so as to intentionally damage its corresponding state-holding device and place the corresponding state-holding device in a highly resistive state. With reference to the present description, "a highly resistive state" may include a state beyond the highest resistance used in the crosspoint array memory or for data storage, an electrically insulating state, a highly resistive state, a state incapable of being reprogrammed, etc. According to various approaches, a highly resistive state may be about 500 MΩ, more preferably about 1 GΩ, still more preferably greater than 1 GΩ, etc.

With continued reference to FIG. 5B, a controller 412 may be present and configured/connected to apply at least one voltage and/or current pulse, and in some approaches, a sequence of voltage and/or current pulses, to a selected one or more of the elements. According to various approaches, the controller 412 may be internal to the memory device, an external testing device, etc.

In a preferred approach, the voltage and/or pulse may be in a "bad polarity" direction and may ramp down very slowly so as to leave the NVM state-holding device in an ultra-high (e.g., about 1 GΩ, but could be higher or lower based on the desired embodiment) resistance state that cannot be broken down for subsequent moderate voltages (e.g., from about 1V to about 2V, but could be higher or lower based on the desired embodiment).

In another example, one technique may apply a first pulse designed to turn a slightly-leaky selection device into a fully-leaky (e.g., highly conductive) select device, and then apply a second pulse designed to damage the NVM. In one approach, the first pulse may be in "good polarity" (e.g., positive voltage) but may pass excessive current, so as to turn a slightly-leaky selection device into a fully leaky device, while the second pulse changes the state holding device to a highly resistive state, burns out a portion of the element (e.g., as a fuse would burn out). According to various approaches, the NVM may include a PCM-type, RRAM, STT-MRAM, CBRAM, etc. or other designs such that preferably the first pulse may not damage the NVM; but rather, may establish conditions so that the second pulse (e.g., with reverse-polarity) may damage the NVM device.

With reference to an illustrative example, a shorter "good polarity" first pulse (e.g., positive voltage) may be applied to an element containing a nearly- or completely-shorted selection device. In the approach that a selection device is nearly-shorted, the first pulse may drive that nearly-shorted selection device into a conductive state. Then a single, longer "bad polarity" pulse (e.g., negative voltage) may be applied after the first pulse, which places the associated state-holding device in a highly resistive state (e.g., greater than 1 GΩ).

In a PCM memory element having a state holding device including $Ge_2Sb_2Te_5$, and without wishing to be bound by any theory, it is believed that the highly resistive state results from phase segregation of Te from the $Ge_2Sb_2Te_5$ material under applied field while the material is molten. The short "good polarity" first pulse causes the device to become molten, but the brevity of the pulse allows the device to then rapidly quench. Then, the single, long "bad polarity" pulse causes the Te-rich material to migrate to the small cross-section at the bottom of the device, thereby forcing the device into a high-resistance state during the slow ramp-down.

According to various other approaches, the voltage and/or current pulse may include rapid sinusoids switching between different polarities, a pulse sequence, a pulse train, a predetermined magnitude, etc. or any other varying temporal aspects or any combination of pulses which would be obvious to one skilled in the art upon reading the present description.

According to one approach, the damage done to the state-holding device may be reversible by incorporating a process such as a high temperature anneal, etc. or any other process which is preferably not part of normal operation of the crosspoint array so that it is not possible for the damage to be unintentionally reversed during operation. Moreover, if the intentional damage done to the state-holding device fades over time, it may be favorable to repeat the process of damaging the same state-holding device.

In yet another approach, an external condition may be applied to the array prior to and/or while applying at least one voltage and/or current pulse. According to various approaches, an external condition is an environmental condition external to the array, and may include a selected temperature, a selected humidity, a magnetic field, etc. Preferably, the external condition in combination with applying at least one voltage and/or current pulse may cause the aforementioned desired damage to the selected one or more of the elements.

According to various approaches, external conditions may be achieved by incorporating a test chip, a magnetic field source, a heat bath, etc. or any other device which would be obvious to one skilled in the art upon reading the present description, to establish such external conditions.

Referring to another illustrative example, a voltage with an opposite polarity may be applied to an element containing a nearly- or completely-shorted selection device in a long pulse. In another approach, large negative voltage may be placed on a large top electrode of a PCM device such that the current may be funneled down to a small bottom electrode and segregate the elements, thereby intentionally damaging the device.

Figure 5C:
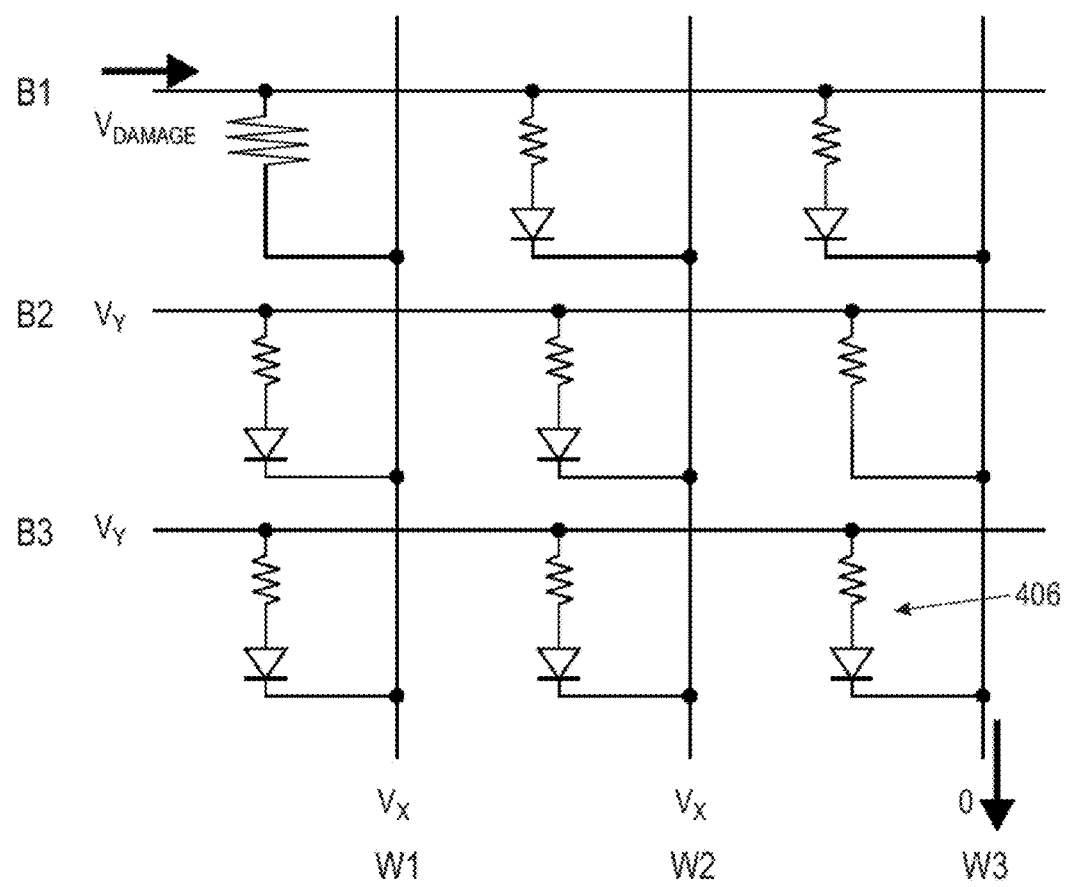

Furthermore, as illustrated in FIG. 5C, the aforementioned applying at least one voltage and/or current pulse may be repeatedly applied to other rows, columns, and/or elements in the array so that all defective elements may be placed in a highly resistive state, e.g., a state-holding device corresponding to a selection device that is partially- or completely-shorted may be placed in a highly resistive state, fuse is burned out, etc.

Figure 5D:
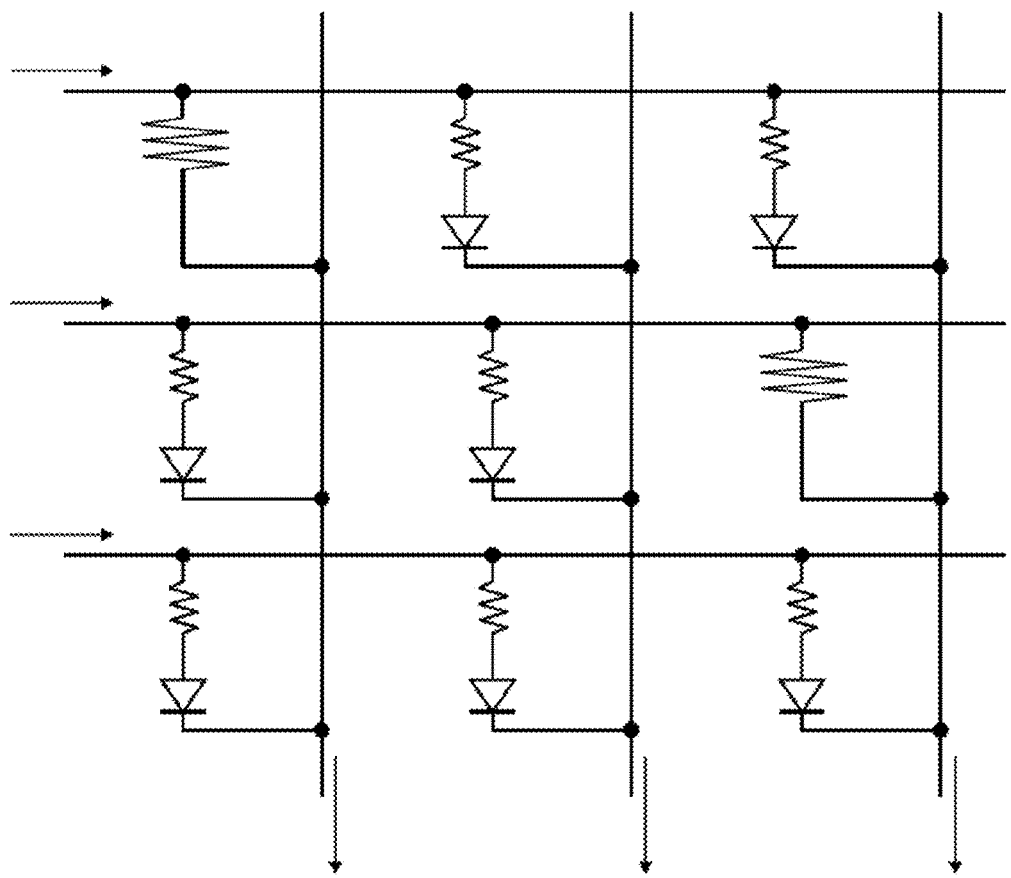

In the example of FIG. 5C, the first element in the top row is depicted as being in a highly resistive state, as being altered in the step shown in FIG. 5B. However, the last element in the top row is also suspected of being defective because bitline B1 and wordline W3 exhibited a leakage. See FIG. 5A. In FIG. 5C, wordline W3 is set to a ground or lower potential and a current and/or voltage pulse is applied to bitline B1 in an attempt to alter the last element in the top row. However, because this element is not defective, the selection device allows only a portion of the current to pass therethrough, thereby protecting the element from damage. The repair procedure is repeated for the bitline and wordline intersections noted by the circles in FIG. 5A. Referring to FIG. 5D, after the repair procedure is completed, the defective elements are disabled, and seven of the nine elements can now be used.

Figure 6:
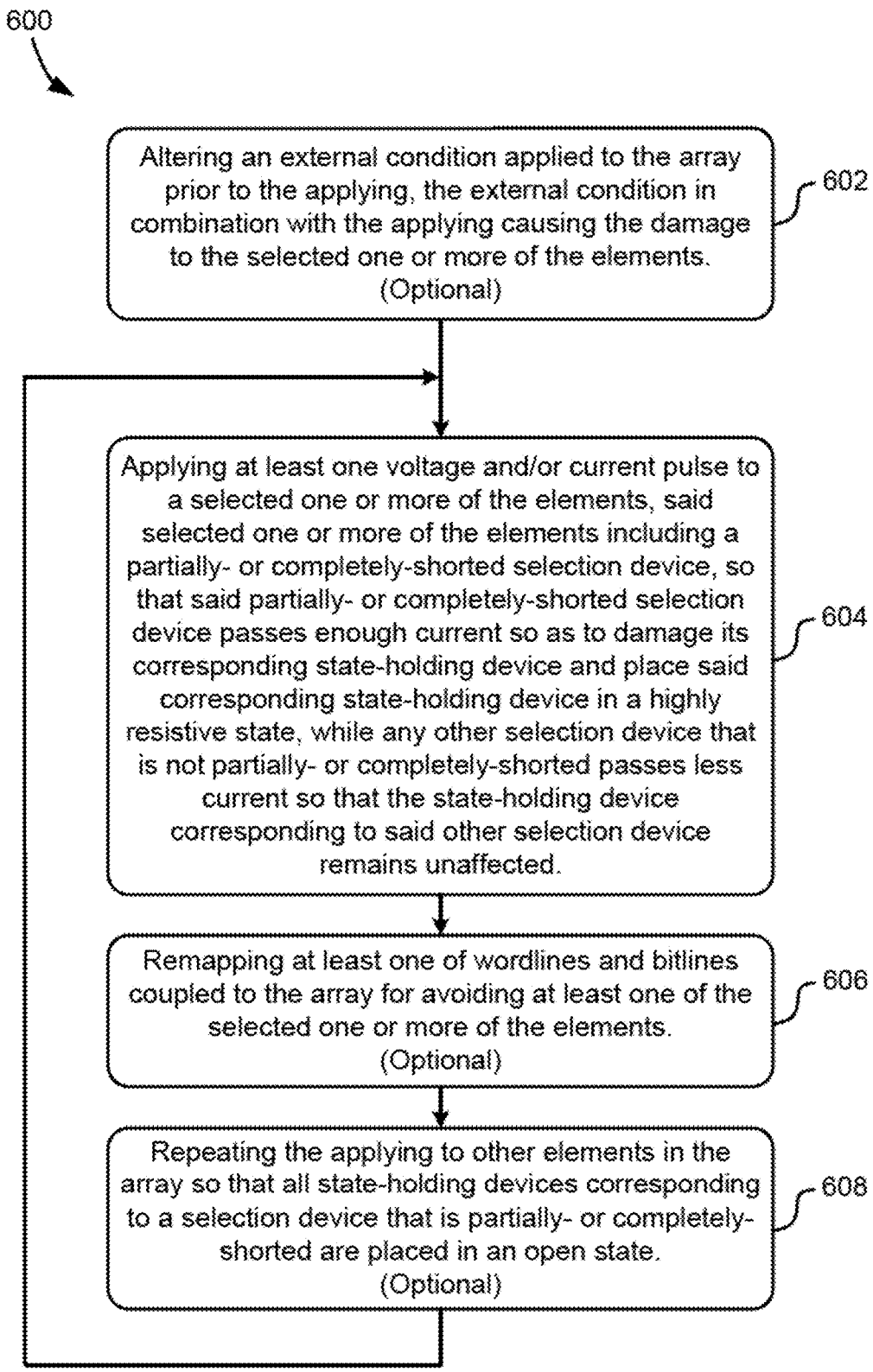
FIG. 6 depicts method process steps according to one embodiment.

FIG. 6 depicts a method 600, in accordance with one embodiment. As an option, the present method 600 may be implemented in conjunction with features from any other embodiment listed herein, such as those described with reference to the other FIGS. Of course, however, such method 600 and others presented herein may be used in various applications and/or in permutations which may or may not be specifically described in the illustrative embodiments listed herein. Further, the method 600 presented herein may be used in any desired environment.

Referring to FIG. 6, according to a preferred embodiment, the method 600 may be implemented using a memory crosspoint array of elements. In one approach, the elements may include phase-change memory elements, resistive memory elements, or other types known in the art. For example, the state-holding devices may be phase-change memory elements or resistive memory elements.

In a preferred approach, each of the elements may include a selection device, which may preferably be in series with a state-holding device. In a further approach, at least one of the elements in the array may have a partially- or completely-shorted selection device.

With continued reference to FIG. 6, the method 600 optionally includes altering an external condition applied to the array prior to applying the at least one voltage and/or current pulse noted in operation 604, below, the external condition in combination with the applying causing the damage to the selected one or more of the elements. See optional operation 602. According to various approaches, the external condition may include, but are not limited to any of the same and/or similar external conditions as those listed above.

Method 600 additionally includes applying at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected (i.e., the other selection device's state-holding ability is not compromised). See operation 604. With reference to the present description, "a highly resistive state" may include a state beyond the highest resistance used in the crosspoint array memory or for data storage, an electrically insulating state, a highly resistive state, a state incapable of being reprogrammed, etc.

With continued reference to FIG. 6, the method 600 optionally includes remapping at least one of word and bitlines coupled to the array to avoid at least one of the selected one or more of the elements. See operation 606. According to one approach, once the location of the elements having a partially- or completely-shorted selection device is known by implementing any of the devices and/or methods described and/or suggested herein, some lines may be remapped to redundant lines. According to various approaches, remapping wordlines and/or bitlines may incorporate a laser, an E-fuse, etc.

In another approach, some, a majority, all, etc. of the partially- or completely-shorted selection devices may be corrected by incorporating Error Correction Code (ECC) processing.

With continued reference to FIG. 6, the method 600 includes optionally repeating the applying of the at least one voltage and/or current pulse to other elements in the array so that all state-holding devices corresponding to a selection device that is partially or completely shorted are placed in a highly resistive state. See operation 608.

According to an illustrative embodiment, the at least one voltage and/or current pulse may preferably cause intentional damage to partially- or completely-shorted devices; but, the same pulse may also preferably induce low (e.g., read-level) currents in the devices that are in series with a good selection device. According to various approaches, a voltage pulse may be below 10V, more preferably below 5V, etc. but could be higher or lower based on the desired embodiment In one approach, any other selection device which is not partially- or completely-shorted may preferably pass less current, so that the state-holding device corresponding to the other selection device may remain unaffected (i.e., its state-holding ability is not compromised).

In a preferred approach, the current may be sufficient to pass through the selected one or more elements to place the selected one or more elements in a highly resistive state. Moreover, other elements that do not exhibit partial or complete-shorting may pass less current so that the other elements remain unaffected. As described above, with reference to the present description, "a highly resistive state" may include a state beyond the highest resistance used in the crosspoint array memory or for data storage, an electrically insulating state, a highly resistive state, a state incapable of being reprogrammed, etc.

According to an illustrative example, if a pulse is applied to a combination of wordlines and bitlines which have a partially- or completely-shorted selection device, the entire voltage pulse will appear across the state-holding device, with very little drop across the selection device. This is simply a consequence of the selection device having very little resistance.

However, in another approach, if the element includes a good selection device (e.g., not shorted or partially shorted), the pulse will experience a voltage divider and will be split across the state-holding device and the selection device. As a result, the element containing the good selection device is not damaged by the pulse.

FIG. 7 depicts a method 700, in accordance with one embodiment. As an option, the present method 700 may be implemented in conjunction with features from any other embodiment listed herein, such as those described with reference to the other FIGS. Of course, however, such method 700 and others presented herein may be used in various applications and/or in permutations which may or may not be specifically described in the illustrative embodiments listed herein. Further, the method 700 presented herein may be used in any desired environment.

Referring to FIG. 7, according to another illustrative embodiment, the method 700 may be implemented with a memory cross-point array of nonlinear elements. According to one approach, each element may be an element having a selection device and a separate state-holding device.

With continued reference to FIG. 7, the method 700 includes applying a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected. See operation 702. According to various approaches, the elements may incorporate any of the embodiments described and/or suggested herein.

In a preferred approach, each of the elements may include a selection device and a state-holding device, wherein applying a current may damage the state-holding device. Although operation 702 includes applying a current, according to various approaches, a current or voltage pulse may be applied to a selected one or more of the elements.

In yet another approach, each of the selected one or more elements may first be rendered into (e.g., urged towards) a more fully shorted state before applying the current that places the selected one or more elements in the highly resistive state.

Figure 4B:
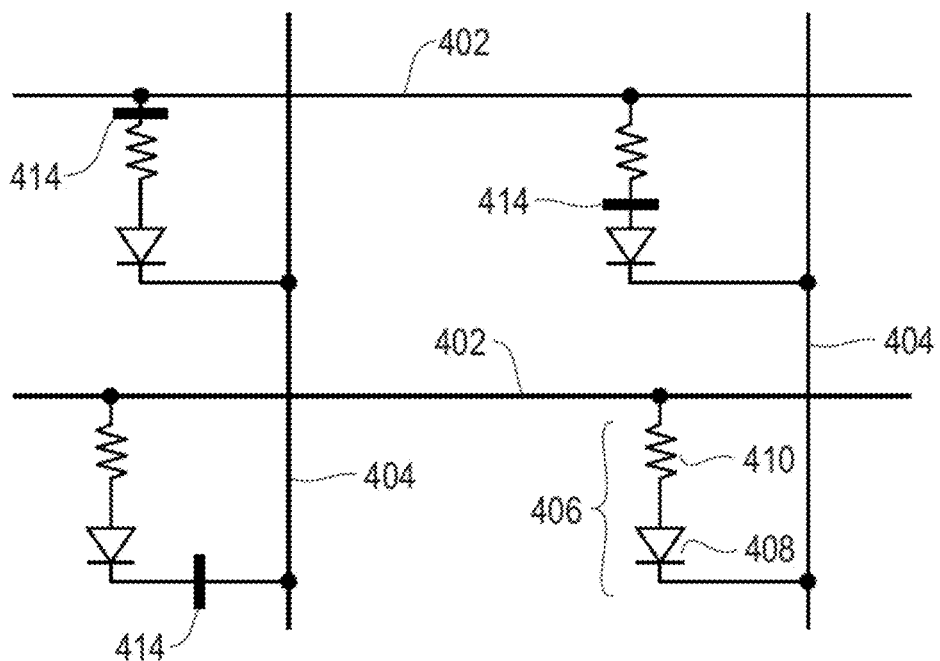
FIG. 4B depicts a circuit diagram of a portion of a crosspoint array according to another embodiment.

In another illustrative embodiment, the methods and/or devices described and/or suggested herein may further incorporate a fuse configured to become damaged when a current is applied thereto. In one approach, the fuse 414 may be incorporated in series with the state-holding device 410 and the selection device 408 in any of various locations, as shown in FIG. 4B. When in series with the state-holding device and the selection device, it is preferable that the fuse is very conductive e.g., having a resistance substantially lower than the lowest resistance of the state-holding device being sensed, e.g., less than about 1 k$\Omega$.

Depending on the embodiment, the fuse may be intentionally damaged by an applied voltage and/or current pulse. According to one approach, the aforementioned voltage pulse may be within a narrow voltage range, such that the voltage pulse may damage the nonvolatile memory element and/or the fuse of the intended element, but not the other devices of the array.

According to one embodiment, to intentionally damage a fuse, the entire array may be subjected to a predetermined temperature which is higher than normal operating temperatures. Moreover, the temperature of the elements containing fuses to be damaged would then be increased to cause the fuses to be damaged. According to various approaches, such heating may include local joule heating, external temperatures, etc. or combinations thereof.

Figure 8:
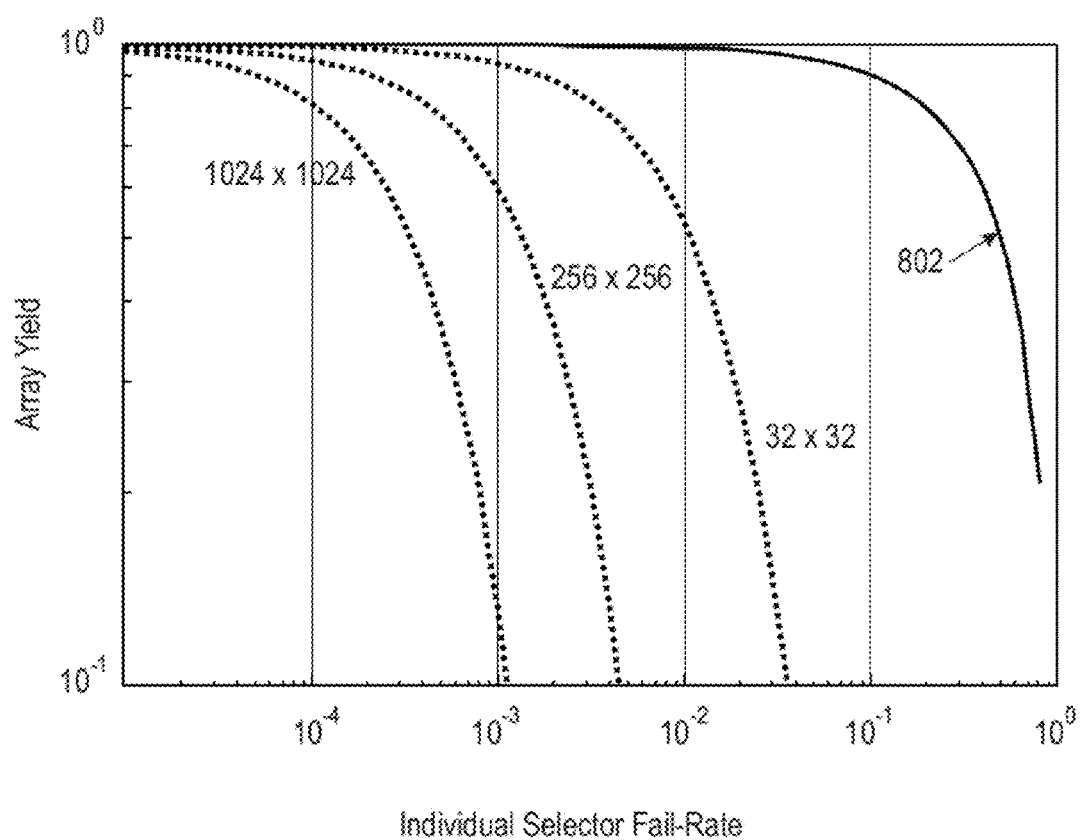
FIG. 8 depicts a graph according to one embodiment.

Thus the array yield (i.e., the fraction of an array available for data storage) may be represented by the selection device yield×NVM yield, which is much higher than without the techniques disclosed herein. Clearly, the individual selector fail-rate to attain a given array yield is now much more tolerant. For conventional designs, a 90% array yield over 1 Mbit requires a selector fail-rate of no more than $5 \times 10^{-5}$. However, implementing the techniques disclosed and/or suggested herein may allow the selector fail-rate to be as high as 10% to achieve the same array yield of 90%. Referring to FIG. 8, the results of an illustrative embodiment is depicted in relation to conventional devices. Particularly, the dashed lines represent the array yield vs. element fail rate curves for memory arrays having the noted array sizes. The solid line 802 illustrates that when a repair procedure as set forth herein is applied to an array (i.e., having an equal array yield and device yield) to disable the defective elements, the array yield with respect to the corresponding individual element fail-rate is dramatically improved. Therefore, error amplification has been eliminated in the embodiments disclosed and/or suggested herein. As described above, additional improvements may also be made by incorporating ECC, remapping wordlines and/or bitlines, etc.

Moreover, depending on the availability of drive current, the repair procedure may be applied to multiple bitlines and/or wordlines simultaneously to reduce the time required for an array repair. Moreover, a verify step may also be implemented to ensure that all leaky selection devices in the crosspoint array are rendered in a highly resistive state.

Of course, this logic may be implemented as a method on any device and/or system or as a computer program product, according to various embodiments.

Moreover, according to various approaches the methods described herein may be performed in the access circuitry, by a controller of the memory array, by a test mode on the chip, etc.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for use with a memory cross-point array of elements, each of which comprises a selection device in series with a state-holding device, the method comprising:
    applying at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

2. The method of claim 1, comprising remapping least one of wordlines and bitlines coupled to the array to avoid at least one of the selected one or more of the elements, wherein a connection between the partially- or completely-shorted selection device and the corresponding state holding device is undamaged by the at least one voltage and/or current pulse, wherein a connection between the corresponding state holding device and a bitline or wordline connected thereto is undamaged by the at least one voltage and/or current pulse.

3. The method of claim 1, wherein the at least one voltage and/or current pulse also damages a fuse coupled to the corresponding state-holding device.

4. The method of claim 1, comprising altering an external environmental condition applied to the array prior to the applying, the external environmental condition in combination with the applying causing the damage to the selected one or more of the elements.

5. The method of claim 1, wherein the state holding devices are phase-change memory elements.

6. A device for use with a memory cross-point array of elements, each of which comprises a selection device in series with a state-holding device, the device comprising:
    a controller, configured to apply at least one voltage and/or current pulse to a selected one or more of the elements, said selected one or more of the elements including a partially- or completely-shorted selection device, so that said partially- or completely-shorted selection device passes enough current so as to damage its corresponding state-holding device and place said corresponding state-holding device in a highly resistive state, while any other selection device that is not partially- or completely-shorted passes less current so that the state-holding device corresponding to said other selection device remains unaffected.

7. The device of claim 6, wherein the controller is configured for remapping at least one of wordlines and bitlines coupled to the array to avoid at least one of the selected one or more of the elements.

8. The device of claim 6, wherein the controller is configured for repeating the applying to other elements in the array so that all state-holding devices corresponding to selection devices that are partially- or completely-shorted are placed in a highly resistive state, wherein a connection between the partially- or completely-shorted selection device and the corresponding state holding device is undamaged by the at least one voltage and/or current pulse, wherein a connection between the corresponding state holding device and a bitline or wordline connected thereto is undamaged by the at least one voltage and/or current pulse.

9. The device of claim 6, wherein the state holding devices are phase-change memory elements.

10. A method for use with a memory cross-point array of nonlinear elements, the method comprising:
    applying a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected,
    wherein each of the elements includes a selection device and a state-holding device, the applying damaging the state-holding device and/or the selection device.

11. The method of claim 10, wherein wherein the elements include phase-change memory elements.

12. The method of claim 10, wherein each of the elements includes a selection device and a state-holding device, the applying damaging the state-holding device and/or the selection device.

13. The method of claim 10, wherein the applying includes a current and/or voltage pulse.

14. The method of claim 10, wherein the elements are resistive memory elements.

15. The method of claim 10, wherein each of the elements further comprises a fuse configured to become damaged when the current is applied thereto.

16. The method of claim 10, comprising rendering each of the selected one or more elements into a more fully shorted state before applying the current that places the selected one or more elements in the highly resistive state.

17. A device for use with a memory cross-point array of nonlinear elements, the device comprising:
    a controller configured to apply a current to a selected one or more of the elements exhibiting a partially- or completely-shorted behavior, the current being sufficient to pass through the selected one or more elements to place the selected one or more elements in a highly resistive state, while any other element that does not exhibit partial or complete-shorting passes less current so that the other elements remains unaffected, wherein the controller is further configured to render each of the selected one or more elements into a more fully shorted state before applying the current that places the selected one or more elements in the highly resistive state.

18. The device of claim 17, wherein each of the elements is a single device configured to provide the functionality of a selection device and a state-holding device.

19. The device of claim 17, wherein each of the elements includes a selection device and a state-holding device, the current damaging the state-holding device and/or the selection device.

20. The device of claim 17, wherein the controller is configured to pulse the current and/or a voltage.

21. The device of claim 17, wherein the elements are resistive memory elements.

22. The device of claim 17, wherein each of the elements comprises a fuse configured to become damaged when the current is applied thereto.

23. The device of claim 17, wherein the elements include phase-change memory elements.

* * * * *